United States Patent [19]

Assaderaghi et al.

[11] Patent Number: 5,759,907
[45] Date of Patent: Jun. 2, 1998

[54] METHOD OF MAKING LARGE VALUE CAPACITOR FOR SOI

[75] Inventors: Fariborz Assaderaghi, Putnam County; Louis L. Hsu; Jack A. Mandelman, both of Dutchess County, all of N.Y.; William R. Tonti, Chitten County, Vt.

[73] Assignee: International Business Machines Corporation, Armonk, N.Y.

[21] Appl. No.: 821,490

[22] Filed: Mar. 21, 1997

Related U.S. Application Data

[62] Division of Ser. No. 724,287, Sep. 16, 1996.

[51] Int. Cl.$^6$ ............................................. H01L 21/8242
[52] U.S. Cl. ............................................. 438/386; 438/155
[58] Field of Search ............................. 438/155, 156, 438/164, 243, 244, 386, 387

[56] References Cited

U.S. PATENT DOCUMENTS

| | | | |
|---|---|---|---|
| 4,153,988 | 5/1979 | Doo | 29/626 |
| 4,751,557 | 6/1988 | Sunami et al. | 357/23.6 |
| 5,055,898 | 10/1991 | Beilstein, Jr. et al. | 438/155 |
| 5,119,155 | 6/1992 | Hieda et al. | 357/23.6 |
| 5,202,279 | 4/1993 | Chung et al. | 438/386 |
| 5,241,211 | 8/1993 | Tashiro | 257/506 |
| 5,276,338 | 1/1994 | Beyer et al. | 257/52 |
| 5,314,841 | 5/1994 | Brady et al. | 437/203 |
| 5,429,981 | 7/1995 | Gardner et al. | 437/60 |
| 5,442,584 | 8/1995 | Jeong et al. | 365/149 |
| 5,466,625 | 11/1995 | Hsieh et al. | 437/52 |
| 5,472,900 | 12/1995 | Vu et al. | 437/60 |

*Primary Examiner*—Chandra Chaudhari
*Attorney, Agent, or Firm*—Whitham, Curtis & Whitham; Daryl K. Neff

[57] ABSTRACT

Large capacitance, low-impedance decoupling capacitors in SOI and their method of fabrication. A high conductivity trench substrate contact is made adjacent to the capacitor by removal of insulator lining the capacitor by use of an extra mask thereby making a substrate contact when the trench is filled with doped polysilicon. The inventive process is compatible with and easily integrated into existing SOI logic technologies. The SOI decoupling capacitors are formed in trenches which pass through the silicon and buried oxide layers and into the underlying silicon substrate.

16 Claims, 6 Drawing Sheets

METHOD OF MAKING LARGE VALUE CAPACITOR FOR SOI

CROSS REFERENCE TO RELATED APPLICATION

This application is a divisional application of Ser. No. 08/724,287, filed Sep. 16, 1996, currently pending.

BACKGROUND OF THE INVENTION

1. Field of the Invention

The invention relates to a large value capacitor for a silicon on insulator (SOI) structure, and, more particularly, a decoupling capacitor for SOI, and a method for its manufacture.

2. Description of the Related Art

High performance circuits require high-value, low-impedance decoupling capacitors between the DC power supply and ground lines to limit noise created by rapid switching of current. As known, this noise can arise, for example, due to inductive and capacitive parasitics. The noise problem is particularly a concern for mixed-mode products (analog/digital), where it is necessary to work with very low signals.

Ideally, the decoupling capacitors are placed as close as possible to the load in order to enhance their effectiveness in reducing the noise in power and ground lines. Consequently, decoupling capacitors have been fabricated directly on the chip.

However, for SOI or bulk MOS high performance circuits the resistance of inversion capacitors is excessively high (>5K-ohm/sq) for decoupling of high frequency noise because of the inversion layer resistance, which is representative of coupling impedance. On the other hand, although accumulation capacitors are effective in bulk MOS, they are not a viable option for SOI because of the high resistance of the thin silicon layer on insulator. Due to other device considerations, such thinner SOI layers are constantly being sought, which aggravates the decoupling capacitor problem. Also, planar junction capacitances are not practical for SOI because of very low SOI to substrate capacitance. None of the decoupling capacitor approaches commonly practiced for bulk MOS technologies prior to this invention provide a fully acceptable solution for high performance SOI circuits.

Due to the poor thermal conductivity of the buried oxide layer, SOI devices that dissipate relatively high power are thrown out of electro-thermal equilibrium with their environment and they also experience higher operating temperatures than their bulk device counterparts.

The high operating temperature is somewhat alleviated by increasing the area of the gate layer over an inversion type decoupling capacitor. However that approach suffers from the drawback of increasing the amount of silicon real estate required to constitute the fabricated circuit. Moreover, the SOI capacitors still have higher than desired impedance. That is, the high inversion layer resistance described above is not easily solved in conventional SOI technology even by increasing the area of the capacitor.

Therefore, there remains an unfulfilled need prior to the present invention for a decoupling capacitor of very low impedance for high performance circuits, such as those fabricated with SOI MOS technology.

SUMMARY OF THE INVENTION

It is an object of the present invention to provide a semiconductor device that provides a means of obtaining large capacitance in a small area that can be used for a decoupling capacitor or other purposes for analog and digital circuits.

It is another object of the present invention to fabricate a high conductivity trench substrate contact next to a capacitor.

It is yet another object of this invention to provide a semiconductor structure endowed with improved SOI electro-thermal stability which provides a high thermal conduction path between active SOI devices and the substrate, and a process for making such a structure.

It is another object of this invention to provide a semiconductor substrate which provides high capacitance with low impedance between an SOI layer and the underlying silicon substrate, and a process for making such a structure.

These and other objects, advantages, and benefits are achieved in the present invention providing large capacitance, low-impedance capacitors in SOI and their fabrication method. A high conductivity trench substrate contact is made adjacent to the capacitor by removal of insulator lining the capacitor by use of an extra mask thereby making a substrate contact when the trench is filled with doped polysilicon.

The inventive process is compatible with and easily integrated into existing SOI logic technologies. The SOI decoupling capacitors are formed in trenches which pass through the SOI and buried oxide layers and into the underlying silicon substrate. The thin dielectric capacitance between the polysilicon trench fill and the substrate is an important advantage provided by the present invention. The substrate also provides a low impedance path for current, thereby minimizing noise in high performance circuits.

In addition to the low electrical impedance path to the substrate provided by the capacitor plate contact, the structure also provides a low thermal resistance path between the SOI layer and the substrate. By using thermal contacts between the SOI and the substrate selectively for high power dissipation devices (i.e., high power drivers), more stable electro-thermal characteristics may be realized. Use of thermal contacts allows the device to rapidly establish electro-thermal equilibrium and also operate at significantly reduced temperature. This results in reduction of temperature dependent effects such as negative differential output conductance and degraded breakdown voltage. The inventive structure also provides local heat sinks for high power devices.

These and other objects and features of the invention will become more fully apparent from the several drawings and description of the preferred embodiments.

BRIEF DESCRIPTION OF THE DRAWINGS

FIG. 8, in particular, illustrates a cross-sectional view taken in the direction indicated in FIG. 9.

DETAILED DESCRIPTION OF THE PREFERRED EMBODIMENTS OF THE INVENTION

Figure 1:
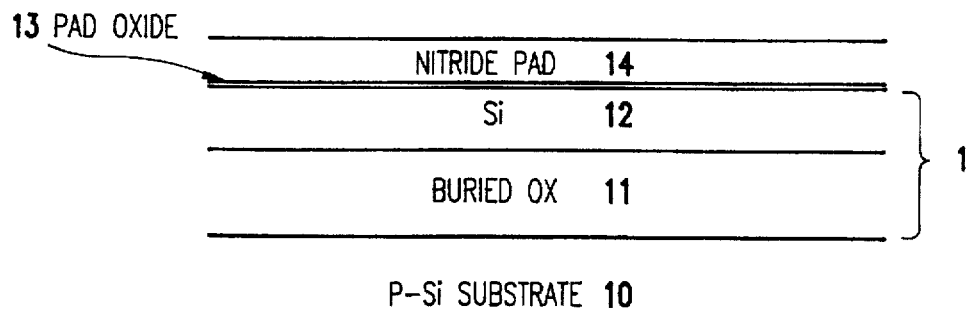
FIGS. 1 through 8 illustrate enlarged, cross-sectional view of a semiconductor structure in accordance with the teachings of the present invention at various stages of fabrication.

Referring now to the drawings, there is shown a representative portion of a semiconductor structure of the present invention in enlarged views at several stages of fabrication. The drawings are not necessarily to scale, as the thicknesses of the various layers are shown for visual clarity and should not be interpreted in a limiting sense unless otherwise indicated herein.

Referring to FIG. 1, a silicon layer 12, which is a single crystal silicon, and a buried insulating oxide layer 11 (e.g., silicon dioxide) are formed on a P-type silicon substrate 10. The silicon layer 12 and insulating layer 11 together constitute the silicon on insulator (SOI) structure 1. The SOI structure 1 can be provided by any conventional technique for fabricating SOI structures. For instance, the SOI structure 1 may be formed by implanting a high concentration of oxygen into bulk substrate 10 by conventional SIMOX technique. Alternatively, the SOI structure 1 can be formed by a conventional bond and etch back process. These and other conventional techniques for forming SOI structures are described, e.g., in U.S. Pat. No. 5,241,211, which descriptions are incorporated herein by reference. The SOI structure 1, as formed on a bulk semiconductor substrate, can be incorporated into the inventive process flow as a preformed SOI wafer. The thickness of the buried oxide layer 11 and silicon layer 12 can vary depending on the device requirements. Generally, the thickness of the silicon layer 12 ranges from approximately 500Å to 5,000Å, and the thickness of the buried oxide layer 13 ranges from approximately 500Å to 1 μm. A pad oxide layer 13 (e.g., silicon dioxide) of approximately 8 nm thickness and a pad nitride layer 14 (e.g., silicon nitride) of approximately 100 nm thickness are sequentially deposited on the silicon layer 12.

Figure 2:
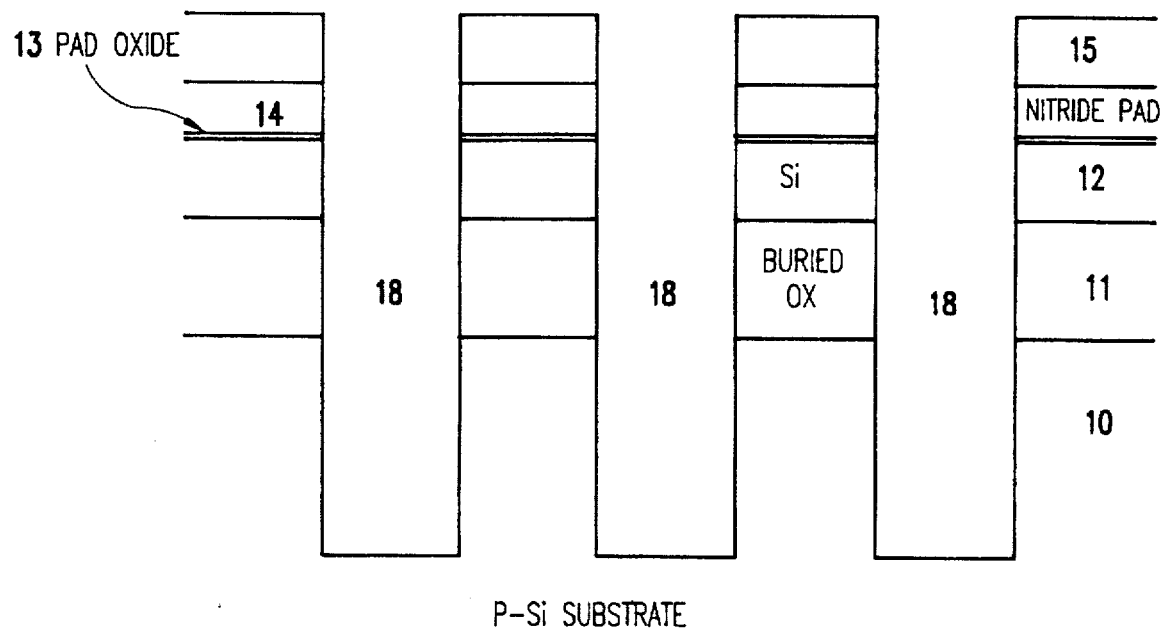

A photosensitive layer 15 (e.g., a photoresist), as shown in FIG. 2, is coated on nitride layer 14 and developed to define a pattern of capacitor trenches. Using the patterned photoresist, the pattern of capacitor trenches 18 is transferred to the nitride layer 14. By anisotropic etching, the pattern is transferred through the pad oxide 13, silicon layer 12, buried oxide layer 11 and ultimately into the underlying silicon substrate 10 to form capacitor trenches 18. The depth of the trenches 18 in the bulk silicon substrate 10 is determined by the desired capacitance. The intermediate construction at this stage of fabrication is shown in FIG. 2. The photoresist 15 is removed at this juncture.

A protective photoresist layer (not shown) is then deposited on upper exposed surface areas of the wafer followed by removal of the photoresist in both the trench regions defining the capacitor trenches 18 and from SOI nitride pad 14 at its areas adjacent the capacitor trenches 18 to expose both these areas for an N+ implant. The patterned remainder of the protective photoresist is not seen in FIG. 2 since it is located outside and defines openings at the capacitor areas of present interest.

Figure 3:
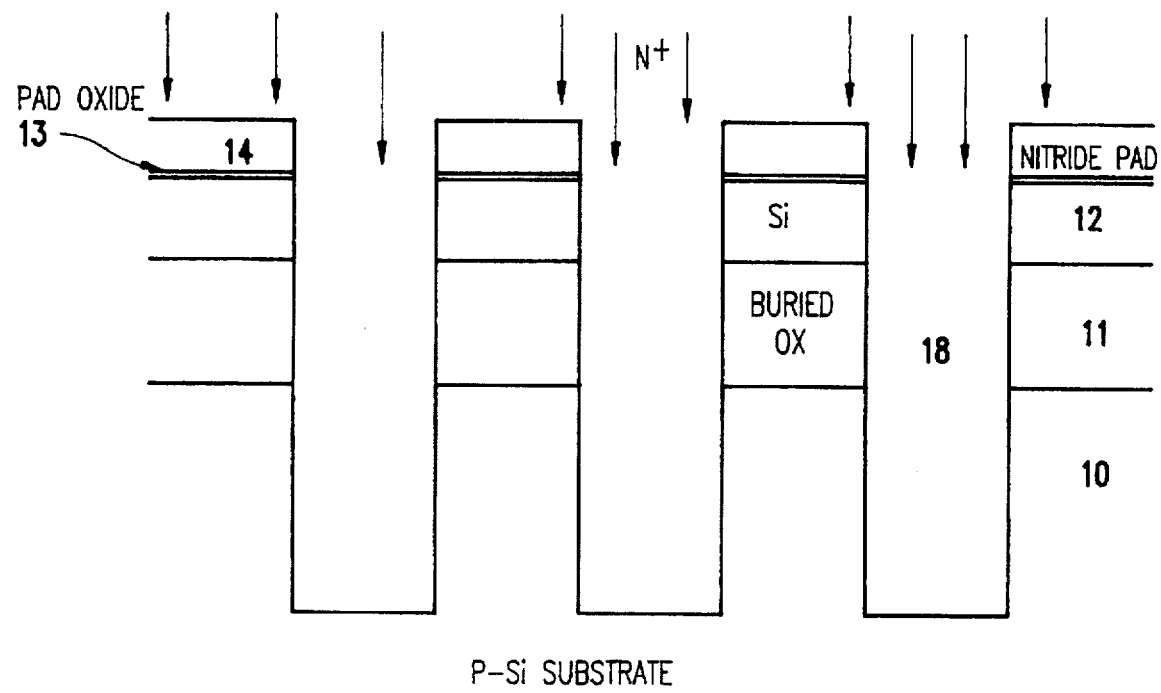
Figure 4:
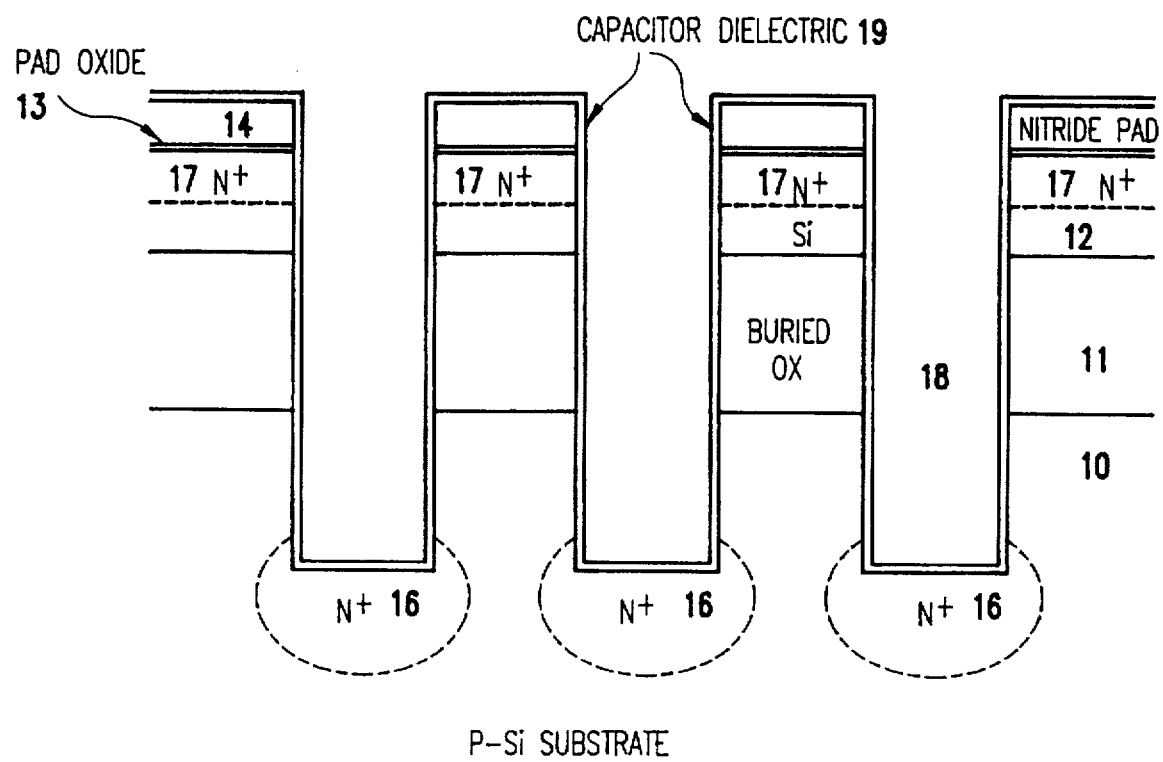

As indicated in FIG. 3, an N+ implantation is performed across the surface of the device. The N+dopant or impurity preferably is a high dose of phosphorus, although, alternatively, other Group IIIA or VA species such as boron or arsenic could be used as the dopant. As shown in FIG. 4, the implant dopant penetrates into both the exposed areas at the trench bottom to form N+ regions 16 and also through nitride layer 14/pad oxide 13 into the SOI surface areas adjacent to the trenches 14 to form N+ zone 17 in the upper surface area of silicon layer 12. The phosphorus implant is performed at an ion energy level of between 5 and 50 KeV and at an ion dose between 1.0E13 and 1.0E15 per cm². The energy is selected such that the peak of the implant lies in the silicon layer 12 adjacent to the trench capacitors (not covered by photoresist). The protective photoresist used at this stage of fabrication blocks the implant from other areas which will later contain active devices, but which are not shown in the present figures as they concern features unessential for obtaining an understanding of the present invention. As can be appreciated, an alternative arrangement for this invention can involve use of a N Type Si substrate 10 and use of a P type implantation dopant to form P+ regions 16 and a P+ zone 17 in the upper surface area of silicon layer 12.

Figure 7:
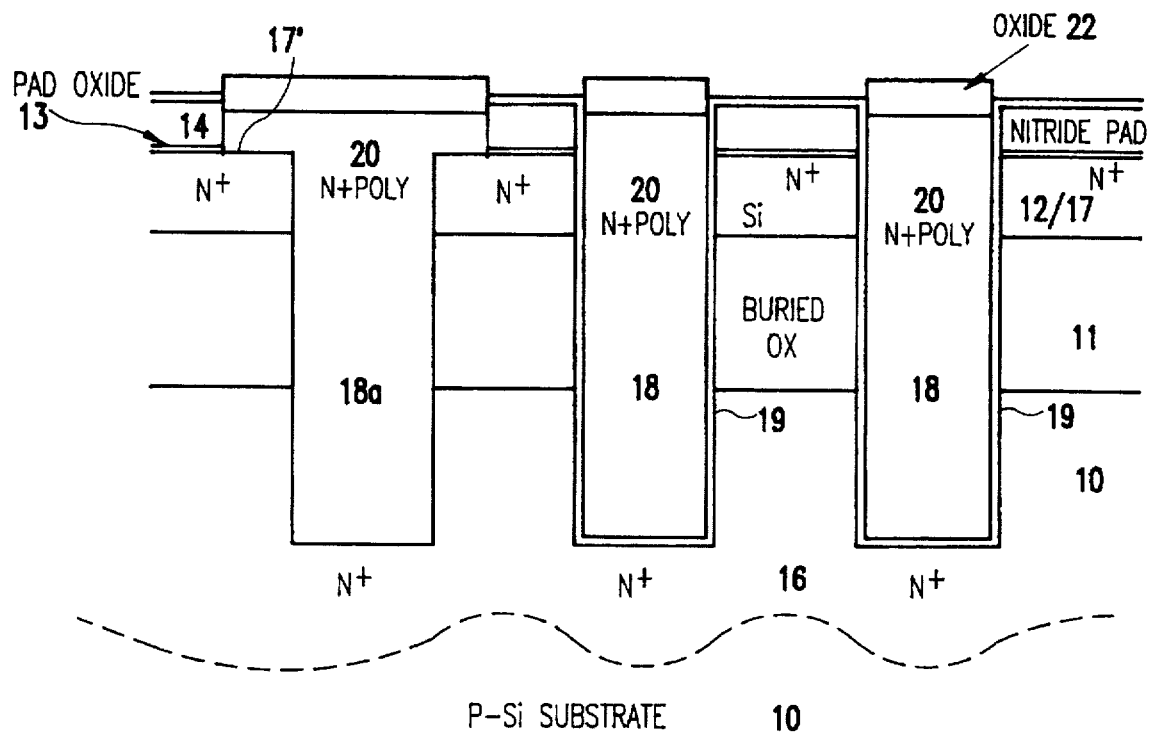

Thermal budget encountered in subsequent processing steps described herein will effectively cause diffusion of the implanted phosphorus such that a continuous N-region 16 will be formed from the trench to trench, and, silicon layer 12 will become doped throughout by diffusion of dopant in N+ zone 17, as best seen in FIG. 7.

Returning to the process flow description, following the removal of the protective photoresist used for implantation of N+ regions 16 and 17, the exposed silicon surfaces of the capacitor trenches 18 are cleaned up with a short sacrificial oxidation and etch. A thin composite nitride/oxide capacitor dielectric layer 19 is then formed using a conventional technique on the walls of the trenches 18 and on the surface of nitride pad layer 14, as seen in FIG. 4, using conventional processing methods employed in DRAM fabrication. For example, dielectric layer 19 can be formed by depositing about 5 nm of nitride followed by nitride reoxidation to grow about 3 nm of overlying oxide.

Figure 5:
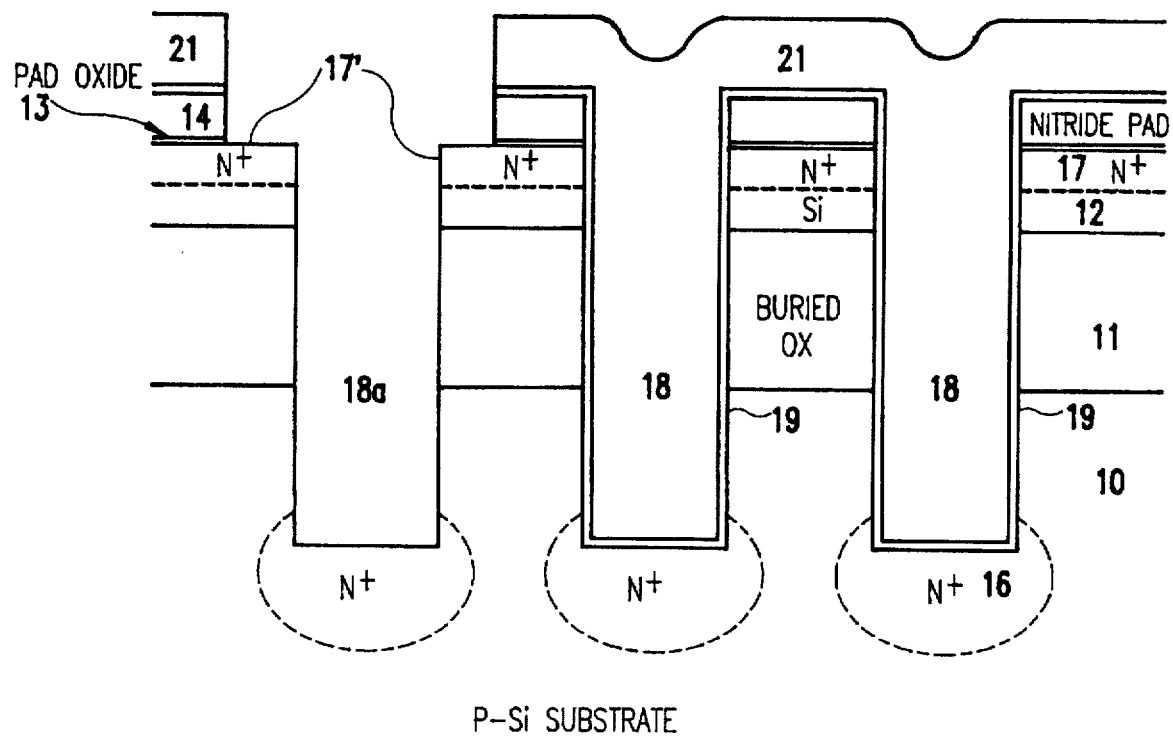
Figure 8:
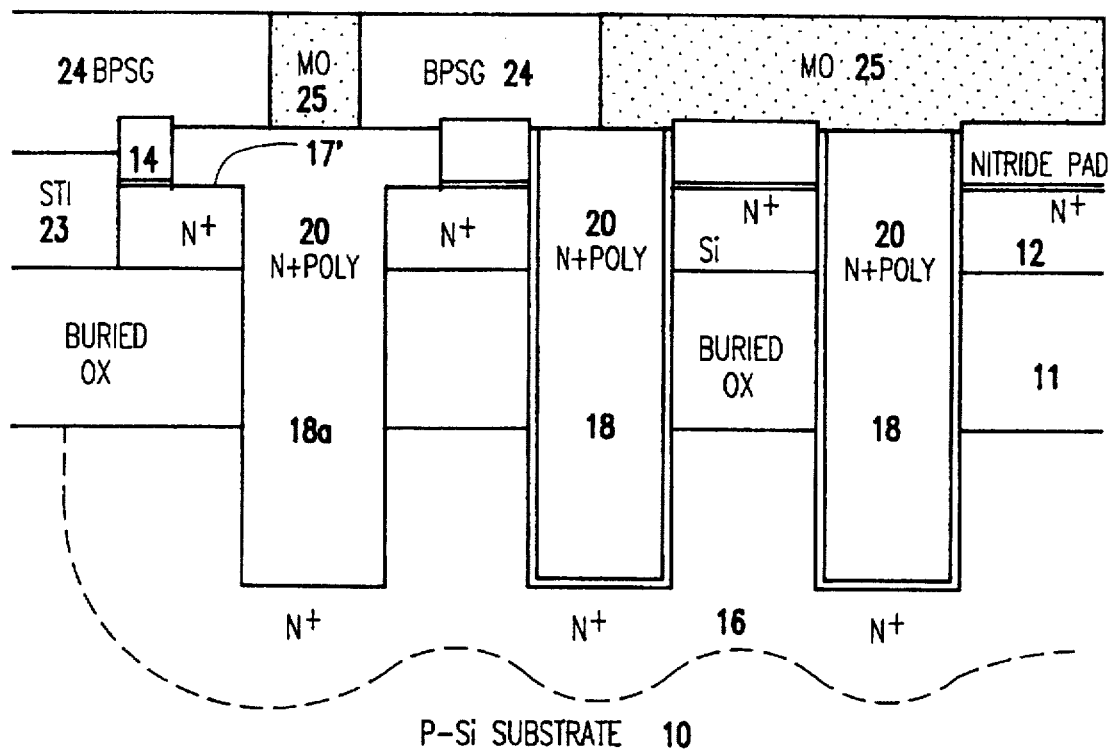

A capacitor plate mask 21 is then used to define the trenches, such as trench 18a indicated in FIG. 5, which will be used to contact the lower diffused capacitor plate 16 shown in FIGS. 7 and 8. The thin dielectric layer 19 is removed from these trenches as well as the surrounding nitride pad material of pad layer 14 and thin pad oxide 13 as best seen in FIG. 5 to expose surfaces 17' of N+ silicon layer 17. While FIG. 5 shows removal of dielectric layer 19 portions from both the trench sidewalls and bottom of trench 18A, it will be understood that the dielectric layer 19 need not be removed from the bottom of trench 18A as long as portions of dielectric layer 19 are removed effective to expose edges of silicon layer 17 and semiconductor substrate 10 which bound and help define trench 18A.

In a preferred embodiment, the etching for this step is a single predominantly directional etch step with a small isotropic component for nitride layer 14 and the thin layer of pad oxide 13 selective to silicon. The small isotropic component is needed to remove the capacitor dielectric component 19 from the trench sidewalls of trench 18A. The etchant chemistry for this step can be a plasma derived from a gas mixture of $CF_4+CHF_3+O_2+Ar$, which has an approximately 10:1 selectivity to silicon and which will remove the approximately 8 nm of pad oxide layer 13 as well as the capacitor dielectric 19 from the inside of the unprotected trench 18A. Photoresist may be used as the etch mask 21 for this step. Alternatively, another type of masking layer, which later can be removed selectively to silicon, silicon dioxide and silicon nitride, e.g., polyimide patterned by a photoresist layer, also may be used for this etch step.

Figure 6:
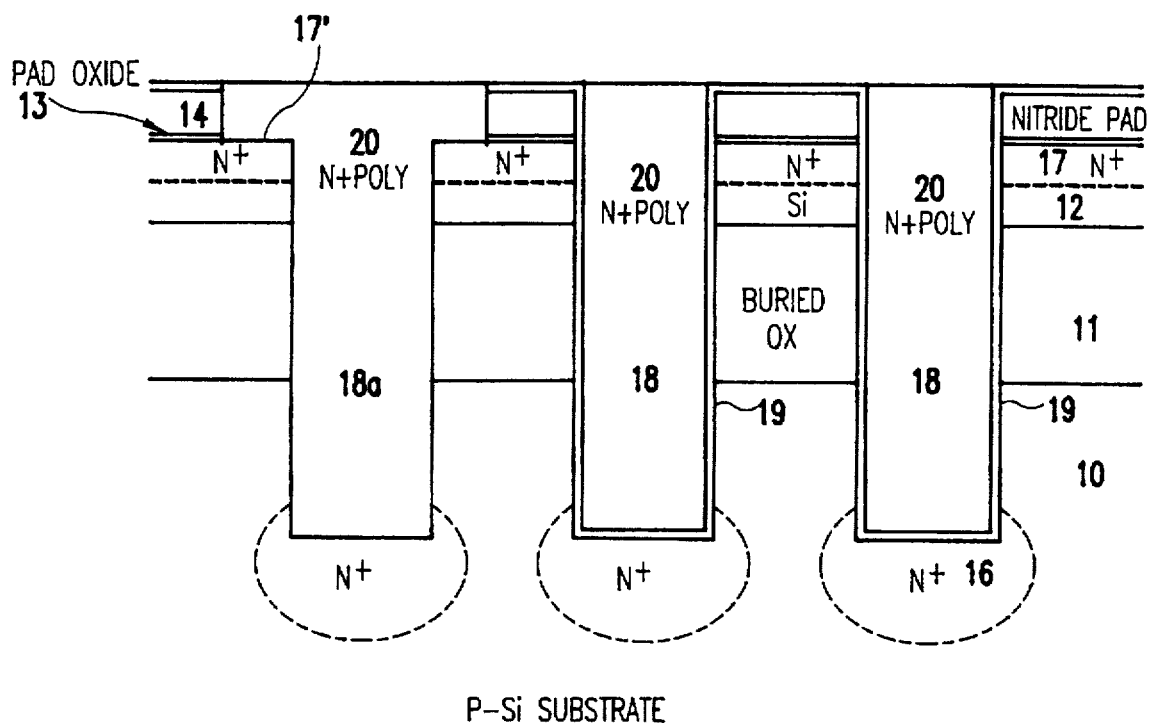

Following stripping of the capacitor plate photoresist mask 21, N+ in situ doped polysilicon 20 is deposited in the trenches 18, 18A and polished back to the top of the pad nitride 14 as shown in FIG. 6. Alternatively, undoped polysilicon can be filled in the trenches 18, 18A and polished back before an N+ implant is performed in conjunction with an implantation mask to dope the polysilicon previously filled into the trenches. The polysilicon trench fill 20 contacts the exposed silicon surfaces 17'. This contact formed between the doped polysilicon 20 filling trench 18A and the exposed silicon surfaces 17' also provides a low thermal resistance path (i.e., a high thermal conduction path) between silicon layer 12 and the merged diffusion region 16 of substrate 10.

Figure 9:
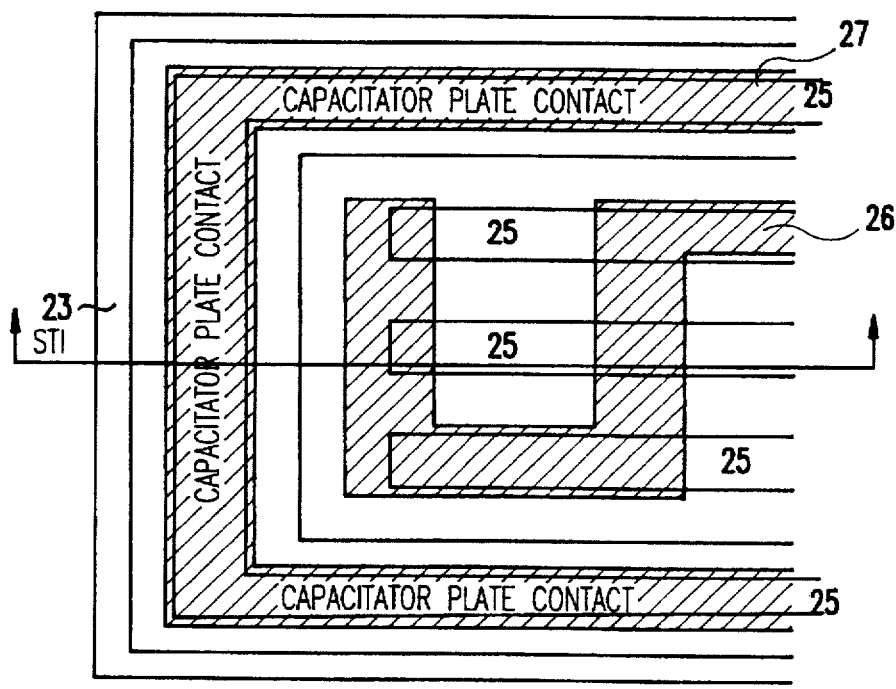
FIG. 9 illustrates an enlarged, top view of a finished semiconductor structure according to the present invention.

Shallow trench isolation (STI) 23, as indicated in FIG. 9, is then defined outside and bounding the capacitor areas of present interest. The original pad layers are also used as the pad for the STI definition. The capacitors are protected by a protective photoresist (not shown) during the etching of the shallow trenches for STI. Alternatively, the capacitors can be protected by a sacrificial layer defined by photoresist if direct use of photoresist is undesirable. An STI "moat" surrounds the decoupling capacitor, providing isolation with respect to adjacent devices.

Standard processing is then practiced to complete the device. For instance, conventional gate sacrificial oxide, gate oxide and gate conductor sidewall oxidations, which are not shown to simplify the illustration in the drawings, are formed. In the course of the gate sacrificial oxide, gate oxide, and gate conductor sidewall oxidations, a small amount of the trench polysilicon is consumed from the top of poly trench fill 20. After the gate sidewall oxidation, a cap oxide layer 22 is formed on the poly trench fill 20 and remains over the capacitor trenches as shown in FIG. 7, which is later removed prior to contacting the capacitor with a first level of metallization 25, which is a local interconnect metallization. The lower capacitor plate diffusions 16 have merged by this stage of fabrication into a continuous diffusion due to thermal budget, as shown in FIG. 7, which is essential for low electrical impedance. Likewise, the dopant implanted in region 17 of layer 12 also has diffused throughout layer 12 by this juncture. Also, the original pad nitride 14 remaining between adjacent trenches 18, 18A and the STI allow a borderless contact to be made to the trench polysilicon 20.

As shown in FIG. 8, the surfaces of the capacitor trenches 18 containing poly trench fill 20 are contacted with the first level of metallization 25 after removal of cap oxide 22. The first level of metallization 25 may be formed by metal deposition in vias formed in borophosphosilicate glass (BPSG) dielectric layer 24.

As shown in FIG. 9, a serpentine trench pattern 26 forms a capacitor node. The capacitor plate contact 27 has the pattern shown in FIG. 9 and is defined where the doped polysilicon trench fill 20 in trench 18A extends from exposed surfaces 17' of silicon layer 12 to the N+ continuous region 16 of substrate 10. In addition to low electrical impedance, the direct contact of the doped polysilicon trench fill 20 to the silicon layer 12 at its surfaces 17' and to the N+ continuous region 16 of substrate 10 provides a low thermal resistance path between the silicon 12 and substrate 10 which may be used to heat sink a high power device (i.e., a driver). Since the silicon layer 12 is also N+ doped between capacitor trenches 18 (and 18A), additional capacitance is obtained from the trench poly to SOI capacitance.

While the invention has been described in terms of a single preferred embodiment, those skilled in the art will recognize that many steps described above can be altered and that dopant species and types as well as other materials substitutions can be freely made without departing from the spirit and scope of the invention.

What is claimed is:

1. Method for forming a capacitor in an SOI circuit, comprising the steps of:

providing an SOI structure on a semiconductor substrate having a dopant type , where in said SOI structure comprises, in this sequence, a buried insulating layer on said semiconductor substrate and a silicon layer;

forming an insulating pad layer on said silicon layer;

forming capacitor trenches extending through said pad layer, said silicon layer and said buried insulating layer and into said semiconductor substrate, said trenches having sidewalls and a trench bottom;

implanting a second dopant of a type different from said first dopant type into portions of said semiconductor substrate located beneath said trench bottoms and into said silicon layer;

forming a dielectric layer over said trench sidewalls and said trench bottoms;

removing (i) portions of said dielectric layer from said sidewalls of at least one of said trenches to expose edges of said silicon layer and said semiconductor substrate where bounding said at least one trench, and (ii) portions of said insulating pad layer to expose surface portions of said silicon layer where bounding said at least one trench; and filling said trenches with conductive material, said conductive material further contacting said exposed surface portions of said silicon layer and said semiconductor substrate bounding said at least one trench to form an electrical contact and a thermal transmission path to said semiconductor substrate in said at least one trench.

2. Method for forming a capacitor in an SOI circuit, comprising the steps of:

providing an SOI structure on a semiconductor substrate having a dopant type, wherein said SOI structure comprises, in this sequence, a buried insulating layer on said semiconductor substrate and a silicon layer;

forming an insulating pad layer on said silicon layer;

forming a pattern of capacitor trenches through said pad layer;

etching said trench pattern through said silicon layer and said buried insulating layer and into said semiconductor substrate, said trenches having sidewalls and a trench bottom;

implanting a second dopant of a type different from said first dopant type into portions of said semiconductor substrate located beneath said trench bottoms and into said silicon layer;

forming a dielectric layer over said trench sidewalls and said trench bottoms;

removing (i) portions of said dielectric layer from said sidewalls of at least one of said trenches to expose edges of said silicon layer and said semiconductor substrate where bounding said at least one trench, and (ii) portions of said insulating pad layer to expose surface portions of said silicon layer where bounding said at least one trench; and filling said trenches with conductive material, said conductive material further contacting said exposed surface portions of said silicon layer and said semiconductor substrate bounding said at least one trench to form an electrical contact and a thermal transmission path to said semiconductor substrate in said at least one trench.

3. The method of claim 2, further comprising forming said insulating pad layer as a composite structure with steps comprising: forming an oxide layer on said silicon layer and then forming a silicon nitride layer on said oxide layer.

4. The method of claim 2, wherein said first dopant type is P type and said second dopant type is N type.

5. The method of claim 2, wherein said first dopant type is N type and said second dopant type is P type.

6. The method of claim 2, wherein said silicon layer comprises a single crystal silicon material.

7. The method of claim 2, wherein said second dopant implanted into portions of said semiconductor substrate located beneath said trench bottoms is merged into a continuous doped portion.

8. The method of claim 2, comprising forming said buried insulating layer and said silicon layer by implanting a high concentration of oxygen into said semiconductor substrate by a SIMOX process.

9. The method of claim 2, comprising forming said buried insulating layer and said silicon layer by a bond and etch back process.

10. The method of claim 2, wherein said etching of said trench pattern comprises anisotropic etching.

11. The method of claim 2, wherein said removing step comprises etching with a plasma.

12. The method of claim 2, wherein said conductive material filling said trenches is selected from the group consisting of doped polysilicon and amorphous silicon.

13. The method of claim 2, wherein said conductive material filling said trenches comprises polysilicon material with a dopant of said second type.

14. The method of claim 13, wherein said first dopant type is P type and said second dopant type is N type.

15. The method of claim 2, wherein said capacitor is a large value capacitor.

16. The method of claim 2, wherein said capacitor is a decoupling capacitor.

* * * * *